United States Patent
Ang et al.

(10) Patent No.: US 6,589,860 B1
(45) Date of Patent: Jul. 8, 2003

(54) SYSTEM AND METHOD FOR CALIBRATING ELECTRON BEAM DEFECT INSPECTION TOOL

(75) Inventors: Boon Yong Ang, Cupertino, CA (US); Kenneth Roy Harris, San Jose, CA (US); Samantha Lee, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/811,190

(22) Filed: Mar. 16, 2001

(51) Int. Cl.[7] ............................................... H01L 21/44
(52) U.S. Cl. .................... 438/613; 438/14; 438/11; 438/15; 438/18; 257/48
(58) Field of Search .......................... 438/11–14, 15, 438/18, 613; 257/48

(56) References Cited

U.S. PATENT DOCUMENTS

| | | | | |
|---|---|---|---|---|
| 4,943,769 A | * | 7/1990 | Golladay et al. | 324/158 |
| 4,972,493 A | * | 11/1990 | Chemaly | 382/8 |
| 5,122,753 A | * | 6/1992 | Myers et al. | 324/537 |
| 5,502,306 A | * | 3/1996 | Meisburger et al. | 250/310 |
| 5,578,821 A | * | 11/1996 | Meisberger et al. | 250/310 |
| 5,612,626 A | * | 3/1997 | Golladay | 324/751 |
| 5,717,204 A | * | 2/1998 | Meisburger et al. | 250/310 |
| 6,091,249 A | * | 7/2000 | Talbot et al. | 324/751 |
| 6,232,787 B1 | * | 5/2001 | Lo et al. | 324/751 |
| 6,252,412 B1 | * | 6/2001 | Talbot et al. | 324/750 |
| 6,261,874 B1 | * | 7/2001 | Francis et al. | 438/133 |
| 6,268,717 B1 | * | 7/2001 | Jarvis et al. | 324/158.1 |
| 6,344,750 B1 | * | 2/2002 | Lo et al. | 324/751 |
| 6,353,222 B1 | * | 3/2002 | Dotan | 250/310 |

OTHER PUBLICATIONS

Lee et al. "Surface grid technique for noncontact e–beam testing of vlsi pacge substrate" Journ. of Vac. Sci. Tech. B vol. 9 No. 4 7–8 1991. p. 1993–2002.*

* cited by examiner

Primary Examiner—Matthew Smith
Assistant Examiner—Granvill D. Lee, Jr.
(74) Attorney, Agent, or Firm—LaRiviere, Grubman & Payne, LLP

(57) ABSTRACT

A system and method for calibrating/characterizing an electron beam (e-beam) defect inspection tool for detecting voltage contrast defects includes deliberately forming defects in a test portion of a semiconductor wafer by deliberately forming an open, short, or abnormal resistance in a circuit feature. The test portion can be in the scribe lines of a product die or on a fully populated test wafer, so that the calibration of the e-beam tool for certain inspection layers of a fabrication technology can be determined. The electron microscope output of the is checked against the known defects to determine whether the tool is accurately sensing defects.

11 Claims, 4 Drawing Sheets

Overall Flow

Overall Flow

In-line monitoring

SYSTEM AND METHOD FOR CALIBRATING ELECTRON BEAM DEFECT INSPECTION TOOL

TECHNICAL FIELD

The present invention relates generally to calibrating electron beam defect inspection tools used for semiconductor testing.

BACKGROUND OF THE INVENTION

Semiconductor wafers, including central processing units (CPUs), can be tested during manufacturing to ensure quality control. One way wafers can be tested is using an electron beam (e-beam) inspection tool, which detects, by way of irradiating a wafer with an electron beam, surface defects as well as so-called "voltage contrast defects" that can be caused by defects in layers underlying the surface layer. Such voltage contrast occurs as a result of differential charge build-up on features, such as metal landing pads. When negative charges accumulate on a feature, the resulting negative potential repels electrons, causing the feature to appear bright under an electron microscope. In contrast, a positive charge build-up causes the feature to appear dark. In this way, an e-beam tool can be used to derive, from the contrast of the return image, whether a defect such as a short or open exists in the wafer.

As recognized by the present invention, it would be advantageous to determine whether and how accurately an e-beam defect inspection tool senses voltage contrast defects, so that the tool can be calibrated and/or characterized. For instance, it would be advantageous to determine whether an e-beam tool senses all defects, or only defects of a certain size. Moreover, the present invention recognizes that it would be advantageous to determine how accurately an e-beam defect inspection tool indicates varying degrees of defects by ascertaining whether the gray scale output by the tool in the presence of voltage contrast defects is correct. Still further, the present invention recognizes that it would be advantageous to make such calibration/characterization measurements in a robust manner, e.g., including during scans of actual product dies, random logic scans, and array mode scans. Having made the above critical observations, the present invention provides the below-solutions to one or more of the observations.

BRIEF SUMMARY OF THE INVENTION

A system includes a semiconductor product that in turn includes repeating electronic test features, at least one of which is formed with a deliberate voltage contrast defect. An electron beam defect inspection tool is disposed adjacent the semiconductor product to detect the defect therein and output a signal in response thereto.

In another aspect, a method for calibrating an electron beam (e-beam) inspection tool includes deliberately forming a voltage contrast defect in a first test feature on a semiconductor device that includes plural repeating test features. The method also includes scanning the device using the e-beam defect inspection tool to render a scan signal. Then, using the scan signal, the inspection tool is calibrated and/or characterized.

In a preferred embodiment, the act of forming the defect includes deliberately establishing an electrical connectivity of the first test feature to be different than analogous electrical connectivities of the repeating test features other than the first test feature. Specifically, the act of forming the defect includes deliberately introducing an electrical short in the first test feature, or deliberately introducing an electrical open in the first test feature, or deliberately introducing an abnormal electrical resistance in the first test feature.

In one non-limiting example, to form a short, first contacts are formed in a first level in electrical contact with a substrate, and second contacts are formed in a second level above the first level. One second contact can be in electrical contact with a first contact such that the second contact is shorted to the substrate.

Or, to establish high resistances or opens, plural identical electronic features can be formed above a semiconductor substrate, with each feature having at least one contact electrically connecting the feature to the substrate. With this structure, an open feature or abnormal resistivity feature is deliberately established by establishing a lesser (or zero) number of contacts for the open feature compared to the number of contacts established for features other than the open feature.

A semiconductor product includes a wafer with plural product dies. Plural test features are in scribe lines of the wafer for in-place testing.

In another aspect, a method of using a wafer including plural product dies and plural test features in scribe lines of the wafer includes scanning the product dies and test features using an e-beam inspection tool, and then comparing scan signals of voltage contrast defects in product dies with scan signals of voltage contrast defects in test features.

Other features of the present invention are disclosed or apparent in the section entitled "DETAILED DESCRIPTION OF THE INVENTION".

DETAILED DESCRIPTION OF THE INVENTION

Figure 1:
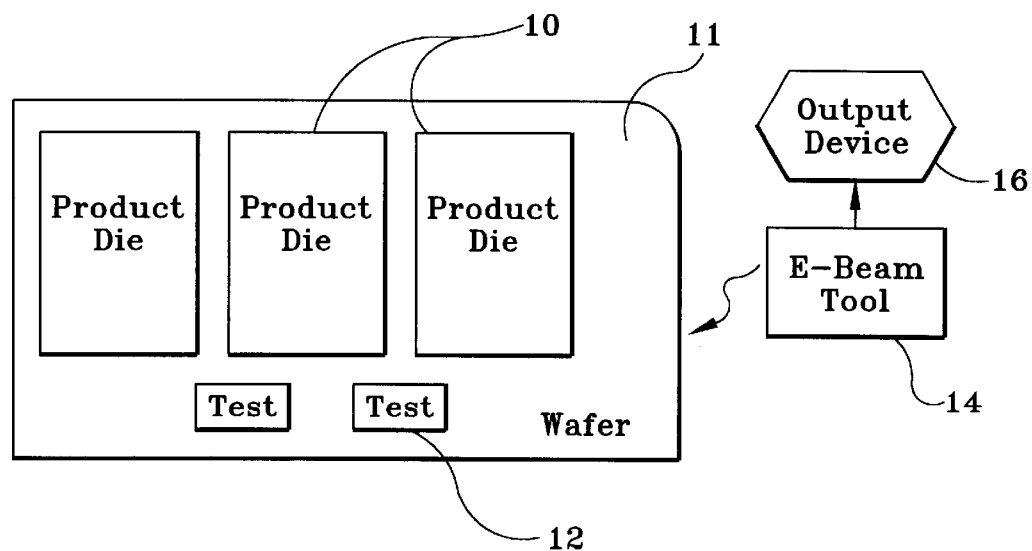
FIG. 1 is a schematic view of the present test wafer in an exploded relationship with an e-beam defect inspection tool.

Referring initially to FIG. 1, a product wafer 11 is shown which incorporates plural product dies 10 and one or more (two shown) test feature areas 12 of the present invention. The dies 10 on the product wafer 11 contain actual circuits, with the wafer 11 also including the test feature areas 12, which can be incorporated in the scribelines of the wafer 11 or other location on the wafer 11 apart from the dies 10. It is to be understood, however, that the wafer 11 is but one example of a semiconductor product that includes repeating electronic test features, with at least one being intentionally formed with a deliberate voltage contrast defect as described further below apart from the dies 10. Other examples include physically separate calibration wafers having only test features thereon.

As shown in FIG. 1, an electron beam (e-beam) inspection tool 14 is disposed adjacent the semiconductor product of the present invention to detect the defect therein and output a signal to an output device 16 in response. The output device 16 can be, without limitation, a video output or computer output showing contrasts in the return beam from the e-beam 14, which can be correlated by a computer to defects in the wafer in accordance with principles known in the art.

Figure 2:
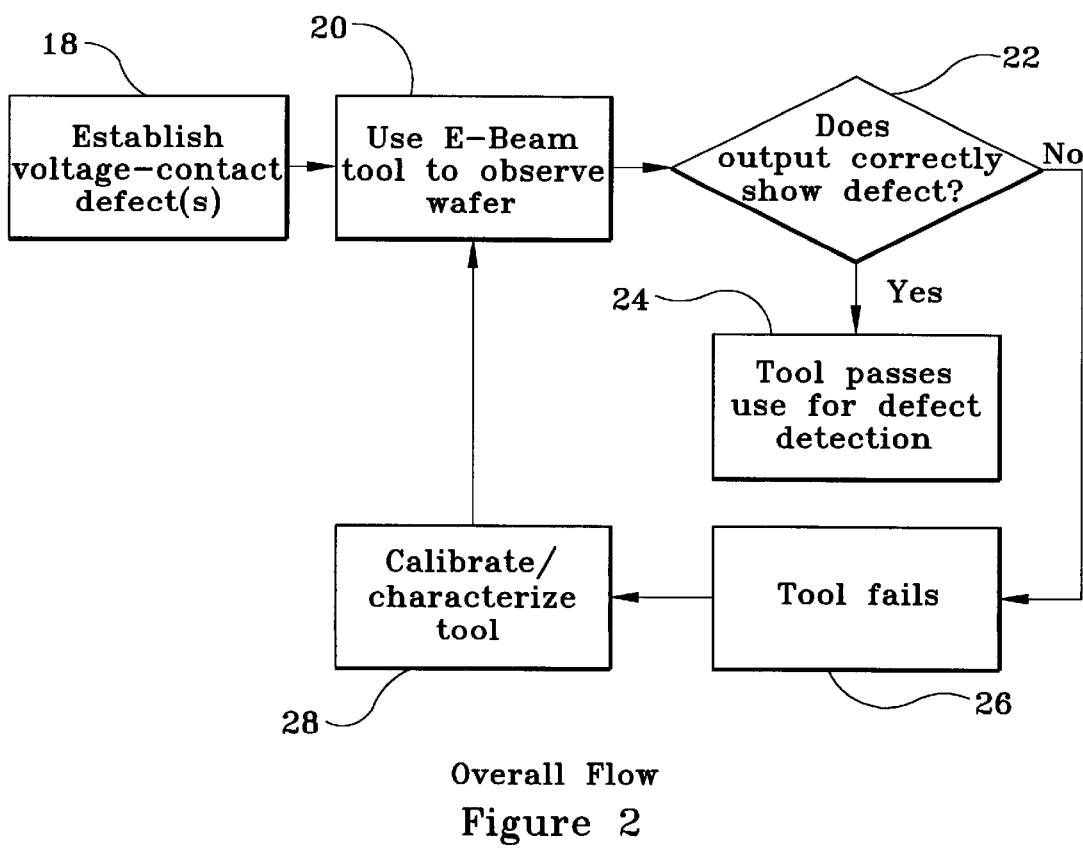
FIG. 2 is a flow chart of the overall logic of the present invention.

FIG. 2 shows the overall logic by which the present invention operates. Commencing at block 18, deliberate voltage contrast defects are intentionally established in the test area 12 as described further below, with the types and locations of the defects being recorded. These defects include electrical opens, electrical shorts, and abnormally high or low electrical resistances, i.e., resistances which, for their location in the structure, are significantly higher or lower than resistances in like locations in non-defective structures. By "deliberately" is meant not accidently, but preplanned by a human or computerized decision maker.

Moving to block 20, the e-beam tool 14 is used to observe the wafer. Proceeding then to decision diamond 22, it is determined, by a human or computer, whether the output correctly shows the known defects. If it does, the tool passes at block 24. Otherwise, the tool fails the test at block 26. The tool is then calibrated as necessary and/or characterized at block 28. "Characterized" is defined in terms of the test outcome, e.g., "outputs a grayscale that is too light for open circuits" and the like.

Figure 3:
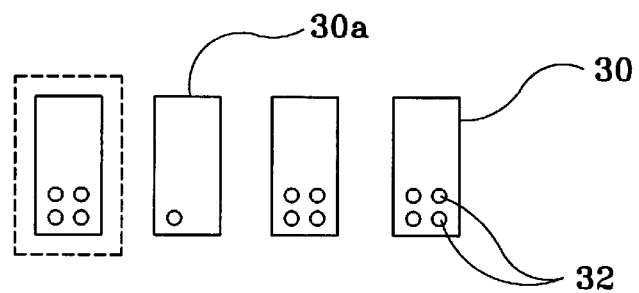
FIG. 3 is a top view of a portion of a test wafer having a defect created by introducing a high resistance or electrical open.
Figure 4:
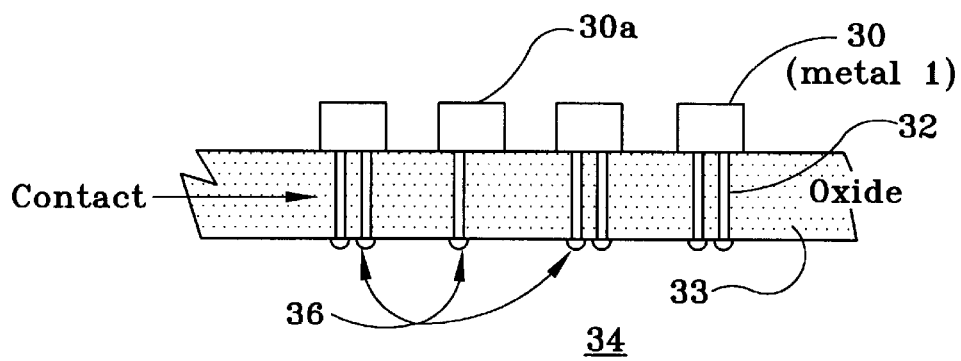
FIG. 4 is a side view of the test wafer shown in FIG. 3.

FIGS. 3 and 4 respectively show top and side views of a portion of the test area 12 that is configured for establishing a deliberate electrical open or abnormal resistance. As shown, repeating electronic test features 30 (e.g., metal 1) are provided with one of the features 30 being a defect feature 30a, in that it has been intentionally formed with a deliberate abnormal resistance (as but one example of a deliberate voltage contrast defect). More specifically, only metal-1 portions of the features 30 are shown, with "normal" features 30 having four contacts 32 extending through an oxide layer 33 to a substrate 34 and with the defect feature 30a having less than four contacts, e.g., one contact, to the substrate 34. The defect feature 30a can also be formed with no contacts, thereby establishing an electrical open. Ohmic connections 36 are established by highly doped regions between each contact 32 and the substrate 34 as shown.

Figure 5:
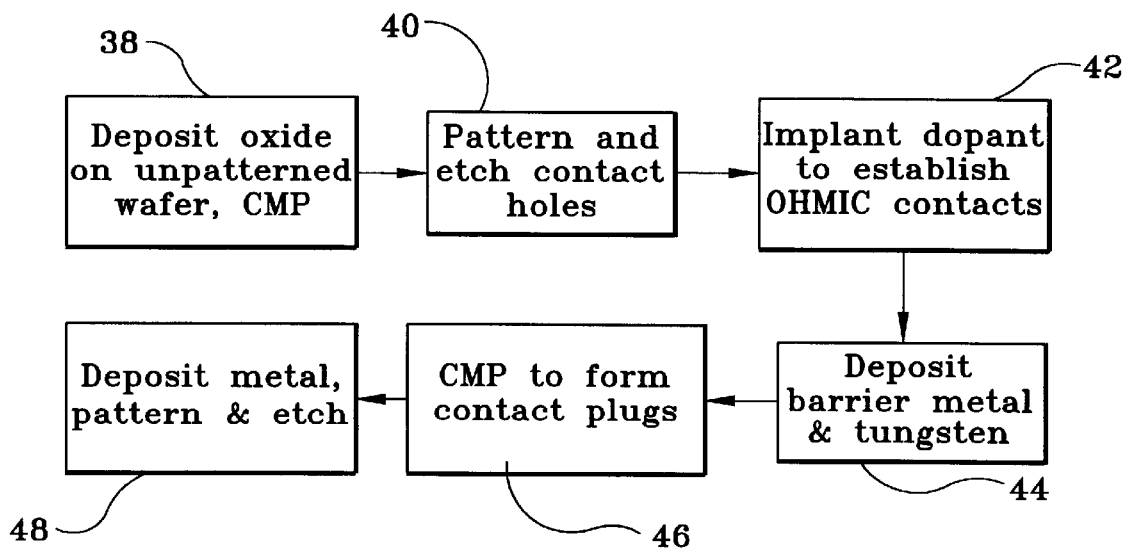
FIG. 5 is a flow chart showing one preferred, non-limiting method for making the wafer shown in FIGS. 3 and 4.

FIG. 5 shows the steps of one exemplary, non-limiting process that can be used to make the device shown in FIGS. 3 and 4. Commencing at block 38, the material that is to become the oxide layer 33 is deposited on the unpatterned substrate 34 and chemically-mechanically polished to planarize the oxide. Then, at block 40 contact holes are patterned and etched through the oxide. The patterning and etching can be undertaken in accordance with methods known in the art, with the present invention dictating that either the size, or number, or both, of the contact holes for the defect feature 30a are established as appropriate to establish the desired abnormal resistance (such as an abnormally high resistance or indeed an electrical open) and, hence, a desired calibration grayshading.

At block 42, dopant is implanted through the holes to establish the ohmic connections 36. Then, the barrier metal and Tungsten (W) or other suitable metal are deposited such that the contacts 32 are formed in the contact holes of the features 30. This is followed by CMP at block 46, with final metallization being deposited, patterned and etched at block 48.

Figure 6:
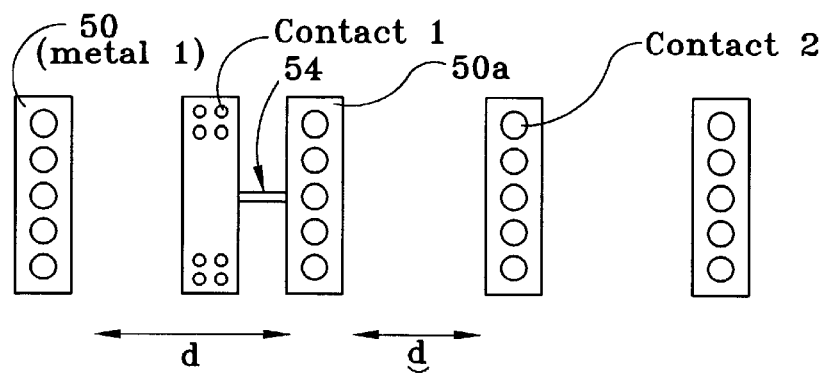
FIG. 6 is a top view of a portion of a test wafer having a defect created by introducing an electrical short.
Figure 7:
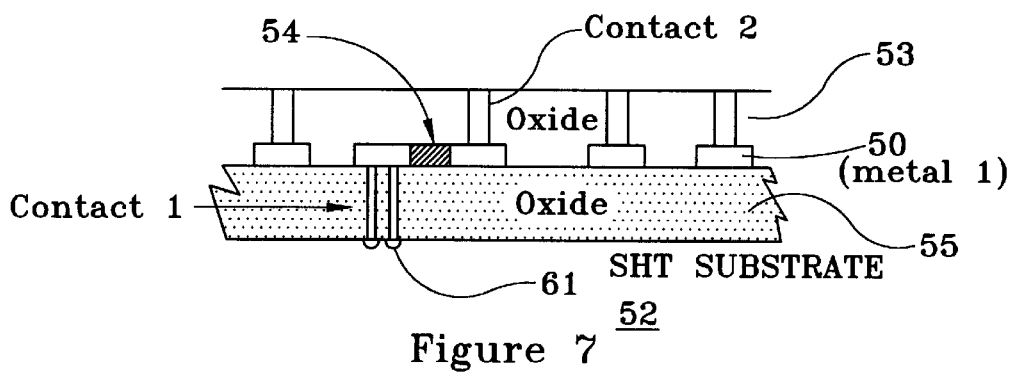
FIG. 7 is a side view of the test wafer shown in FIG. 6.

Additionally, a voltage contrast defect can be established by a circuit that includes an electrical short, as shown in FIGS. 6 and 7. As shown, test features 50 (e.g., metal 1) that are equidistantly spaced from each other as indicated by the distance arrows "d" are formed, with one of the features 50 being a defect feature 50a in that it is shorted to a substrate 52 (FIG. 7). Specifically, a contact "2" of the defect feature 50a is grounded through an upper oxide layer 53 to the substrate 52 through a short 54 between the contact "2" and a contact "1" that extends to the substrate through a lower oxide layer 55. The resistance of the short 54 can be established as desired to achieve a calibration gray scale.

Figure 8:
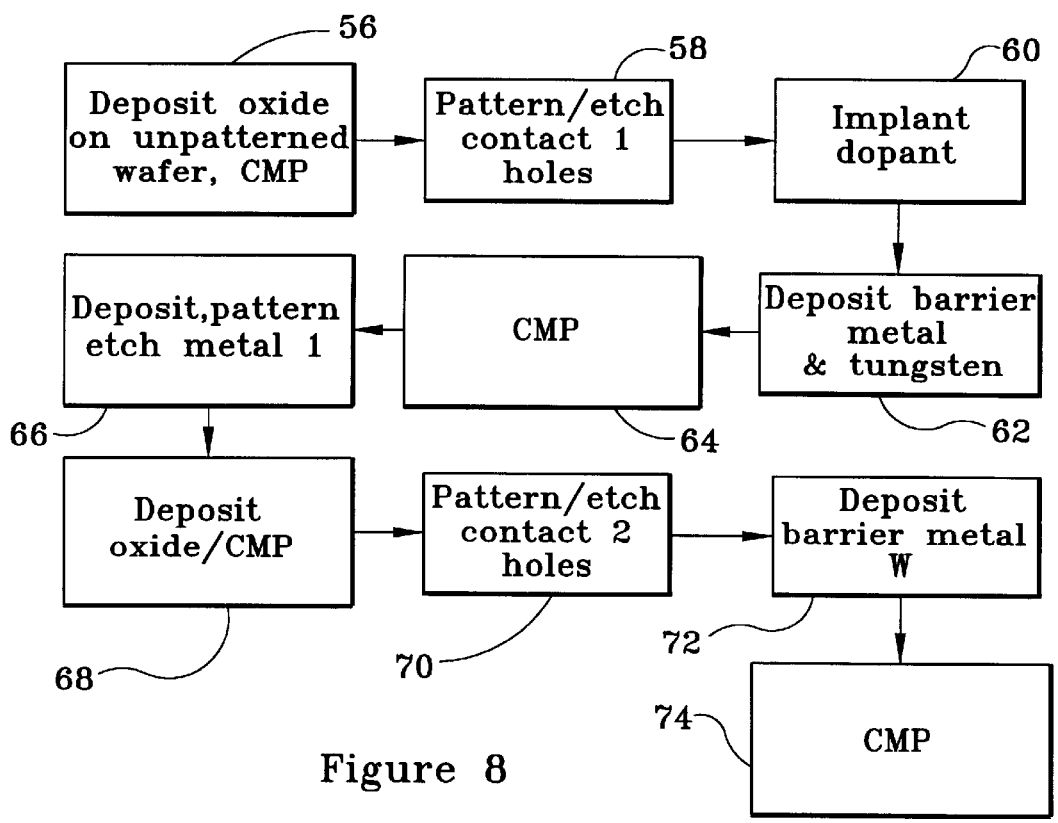
FIG. 8 is a flow chart showing one preferred, non-limiting method for making the wafer shown in FIGS. 6 and 7.

FIG. 8 shows one exemplary, non-limiting method for making the device shown in FIGS. 6 and 7. Commencing at block 56, material that is to become the lower oxide layer 55 is deposited on the substrate 52 and CMP is used to planarize it. Then, contact "1" holes are patterned and etched at block 58. Next, at block 60, dopant is implanted through the contact "1" holes to establish ohmic connections 61 (FIG. 7) to the substrate 52.

Proceeding to block 62, barrier metal and Tungsten (W) or other suitable metal are deposited and planarized using CMP at block 64. This is followed by depositing, patterning, and etching the metal "1" at block 66. During the patterning, the short 54 is established.

Moving to block 68, the material that is to become the upper oxide layer 53 is deposited and planarized. The contact "2" holes are then patterned and etched through the upper oxide layer 53 at block 70. Barrier metal and Tungsten (W) are then deposited at block 72 and planarized at block 74 to establish the contacts "2".

With the above disclosure in mind, it is to be appreciated that the present invention is a reliable and economic way to calibrate and characterize e-beam based defect inspection tools. Its compatibility with CMOS fabrication technology, including single layer and multi-layer wafers, enables the test structures to be incorporated into a product wafer, such that information can be inferred from the voltage contrast defects in the product die by comparing their gray scale to those in the well-characterized test structures. Moreover, the present invention can detect false "counts" from an inspection tool since the locations and density of the intentional voltage contrast defects are known, i.e., any "defect" signals from the tool that come from non-defect test structures in the test area are "false counts". The invention is easy to design and make, and permit repeated use of calibration wafers.

Figure 9:
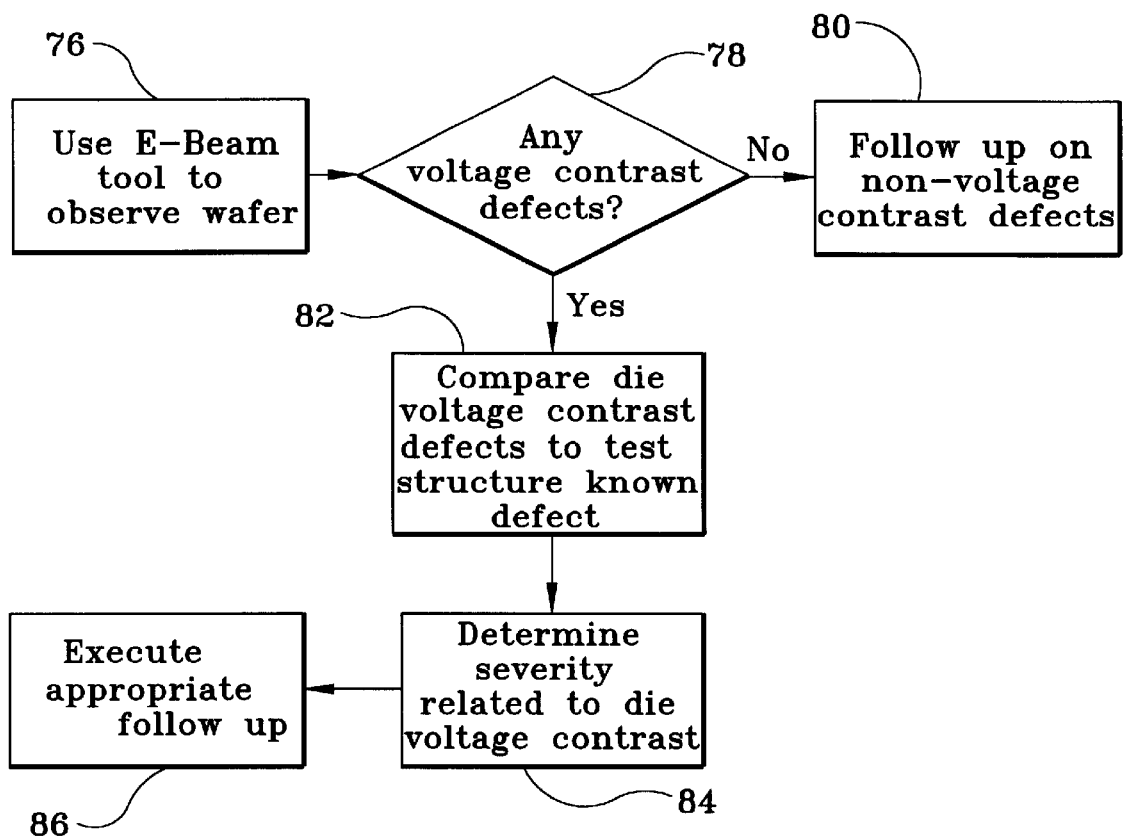
FIG. 9 is a flow chart showing the in-line monitoring steps.

FIG. 9 shows the steps of in-line product monitoring. Commencing at block 76, the e-beam tool 14 is used to observe a wafer. Moving to decision diamond 78, it is determined whether any voltage contrast defects have been observed in accordance with principles known in the art. If no voltage contrast defects are observed, follow-up for any non-voltage contrast defects is undertaken at block 80. Otherwise, at block 82 the observed voltage contrast defects are compared to the known test area 12 defects that are on the wafer being tested. Proceeding to block 84, the severity of the observed voltage contrast defects are determined based on, e.g., the differences in grayscale between the observed voltage contrast defects and the known voltage contrast defects in the test area 12. Appropriate follow-up action, based on the severity, is undertaken at block 86.

While the particular SYSTEM AND METHOD FOR CALIBRATING ELECTRON BEAM DEFECT INSPEC- TION TOOL as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for".

What is claimed is:

1. A system, comprising:
    a semiconductor wafer including repeating electronic test features, at least one test feature being formed on the wafer with a deliberate voltage contrast defect; and
    at least one electron beam defect inspection tool disposed adjacent the semiconductor wafer to detect the defect therein and output a signal in response thereto.

2. The system of claim 1, wherein the product further includes electronic product features juxtaposed with the test features.

3. A method for calibrating an electron beam (e-beam) inspection tool, comprising:
    deliberately forming at least one voltage contrast defect in a first test feature on a semiconductor wafer including plural product dies;
    scanning the wafer using the e-beam defect inspection tool to render a scan signal; and
    using the scan signal, calibrating and/or characterizing the inspection tool.

4. The method of claim 3, wherein the act of forming the defect includes deliberately establishing an electrical connectivity of the first test feature to be different than analogous electrical connectivities of features other than the first test feature.

5. The method of claim 3, wherein the act of forming the defect includes deliberately introducing an electrical short in the first test feature.

6. The method of claim 5, further comprising:
    forming at least first contacts in a first level in electrical contact with a substrate; and
    forming at least second contacts in a second level above the first level, at least one second contact being in electrical contact with at least one first contact such that the at least one second contact is shorted to the substrate.

7. The method of claim 3, wherein the act of forming the defect includes deliberately introducing an electrical open in the first test feature.

8. The method of claim 7, further comprising:
    forming plural identical electronic features above a semiconductor substrate, each feature having at least one contact electrically connecting the feature to the substrate, whereby an open feature is deliberately established by establishing a zero number of contacts for the open feature compared to the number of contacts established for features other than the open feature.

9. The method of claim 3, wherein the act of forming the defect includes deliberately introducing an abnormal electrical resistance in the first test feature.

10. The method of claim 9, further comprising:
    forming plural identical electronic features above a semiconductor substrate, each feature having at least one contact electrically connecting the feature to the substrate, whereby an abnormal resistivity feature is deliberately established by establishing a contact size or contact number for the abnormal resistivity feature that is different than contact sizes or numbers established for features other than the abnormal resistivity feature.

11. A method of using a wafer including plural product dies and plural test features in scribe lines of the wafer, comprising:
    scanning the product dies and test features using an e-beam inspection tool; and
    comparing scan signals of voltage contrast defects in product dies with scan signals of voltage contrast defects in test features.

* * * * *